United States Patent [19]

Quievy

[11] Patent Number: 4,906,948
[45] Date of Patent: Mar. 6, 1990

[54] OSCILLATOR WITH PIEZOELECTRIC RESONATOR

[75] Inventor: Didier Quievy, Massy, France

[73] Assignee: Thomson-CSF, Paris, France

[21] Appl. No.: 215,818

[22] Filed: Jul. 6, 1988

[30] Foreign Application Priority Data

Jul. 7, 1987 [FR] France .................. 87 09623

[51] Int. Cl.$^4$ .............................................. H03B 5/32
[52] U.S. Cl. .................................................... 331/158
[58] Field of Search ........ 331/107 A, 116 R, 116 FE, 331/135, 136, 158; 368/159

[56] References Cited

U.S. PATENT DOCUMENTS 3,699,476 10/1972 Mancini ...................... 331/116 R
3,743,868 7/1973 Kawada ...................... 331/158 X

FOREIGN PATENT DOCUMENTS 2245476 3/1974 Fed. Rep. of Germany .
3124492 5/1983 Fed. Rep. of Germany .
0091505 7/1981 Japan .................... 331/158
1366858 9/1974 United Kingdom .

OTHER PUBLICATIONS

ELECTRONICS COMPONENT & APPLICATIONS, vol. 7, No. 2, 1985, pp. 73-76, Eindhoven, NL; J. Exalto, "Crystal Oscillators Using HCMOS ICs".
PATENT ABSTRACT OF JAPAN, vol. 9, No. 47, (W-299) (1770), Feb. 27, 1985; & JP-A-59 188 203 (Hitachi Seisakushio K.K.) 25-10 1984.

Primary Examiner—Eugene R. Laroche
Assistant Examiner—Robert J. Pascal
Attorney, Agent, or Firm—Cushman, Darby & Cushman

[57] ABSTRACT

An oscillator with a piezoelectric resonator is disclosed. Said oscillator comprises a resonator, for example, a quartz resonator, looped through a phase-shifting device and voltage-increasing means on a logic gate. Furthermore, the logic gate is biased by a resistor. The use of a logic gate gives excellent short-term stability at a very low cost. For example, the use of CMOS technology gives higher performance than that of oscillators using analog amplifiers, and does so at lower cost. The invention can be applied mainly to the making of oscillators that are highly stable, especially in the short term, and to the making of devices using oscillators of this type. Non-exhaustive examples of such devices include radars, transmitters, receivers, synchronizing devices, motor control devices, clocking devices and computers.

14 Claims, 2 Drawing Sheets

OSCILLATOR WITH PIEZOELECTRIC RESONATOR

BACKGROUND OF THE INVENTION

1. Field of the Invention

The present invention relates chiefly to a piezoelectric quartz oscillator.

2. Description of the Prior Art

The use of oscillators with piezoelectric quartz resonators is becoming widespread for both consumer articles and professional equipment. Known types of oscillators have a piezoelectric resonator which is series-connected with an analog component of the linear amplifier type.

Prototypes of quartz oscillators using logic gates have been made. These oscillators have not been much developed because of their low performance.

The present invention enables the making of oscillators comprising piezoelectric resonators and at least one logic gate, these oscillators showing excellent performance characteristics and, especially, excellent short-term stability. Thus, an oscillator is obtained that has higher performance than an oscillator using analog circuits, with simplicity of construction and low cost derived from the use of the logic circuits.

The oscillator according to the present invention has a loop with the following elements connected in series: a logic gate, a piezoelectric resonator, phase-shifting means and voltage-increasing means. The output of the voltage-increasing means is connected to the input of the logic gate. Thus, the entire input dynamic range of the logic gate is used, and the load impedance of the piezoelectric resonator is reduced.

The short-term stability relates to short-term phase fluctuations of the signal coming from the oscillator. An ideal oscillator tuned to the resonance frequency $f_o$, gives a Dirac peak at the frequency $f_o$ and no energy at other frequencies. Unfortunately, no such oscillator exists. In particular, an oscillator also generates energy around the frequency $f_o$.

The oscillator according to the present invention enables a reduction in the short-term contribution of the energy generated around the frequency $f_o$, at low cost and in an easily reproducible way.

SUMMARY OF THE INVENTION

The main object of the invention is produced by an oscillator comprising a piezoelectric resonator and a logic circuit, said oscillator including a loop having, in addition to said logic circuit and said piezoelectric resonator, voltage-increasing means, said logic gate being biased by a resistor and/or a self-inductance coil.

BRIEF DESCRIPTION OF THE DRAWINGS

The invention will be better understood from the following description and the appended drawings, given as non-exhaustive examples, of which:

FIGS. 1 to 5 use the same references to designate the same elements.

DESCRIPTION OF PREFERRED EMBODIMENTS

Figure 1:
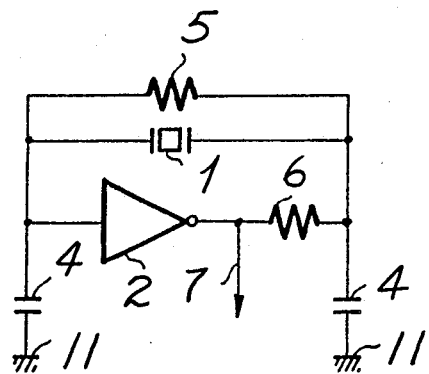
FIG. 1 is a diagram of a known type of oscillator.

FIG. 1 shows a prototype of a prior art type of oscillator with a quartz resonator. The oscillator has a quartz resonator 1 connected in a loop further comprising an inverter 2 and a resistor 6. A bias resistor is series-connected at the terminals of the inverter 2 and the resistor 6. The terminals of the resonator 1 are connected by two capacitors 4 to the ground 11. The signal is collected at an output 7 of the inverter logic gate 2.

The inverter 2 creates a phase shift of 180° between the desired input and output signals. To this phase shift must be added a phase shift that increases with the oscillation frequency, due to the necessary propagation time. The resistor 6, the resonator 1 and the capacitor 4 provide the additional phase shift needed to obtain oscillation. The resistor 5 biases the logic gate 2 around an operating point located at half of the supply voltage. Thus, the logic gate 2 can be used with weak signals as a linear amplifier.

However, the device of FIG. 1 has low short-term stability. This is especially due to the fact that the input dynamic range of the gate 2 is not entirely used because the presence of the resistor 6 and the capacitors 4 weakens the signal given by the gate resulting in a deterioration of the signal-to-noise ratio.

Furthermore, the load impedance of the quartz resonator 1 is relatively high. The high load impedance of quartz does not enable the use of the best overvoltage factor under the load of quartz. This leads to additional deterioration of the signal-to-noise ratio for modulation frequencies below $f_o/2xQ$, where Q is the overvoltage factor under load of the resonator. Thus, the performance displayed by the oscillator shown in FIG. 1 is substantially lower than that of the oscillator comprising a known type of analog amplifier.

Figure 2:
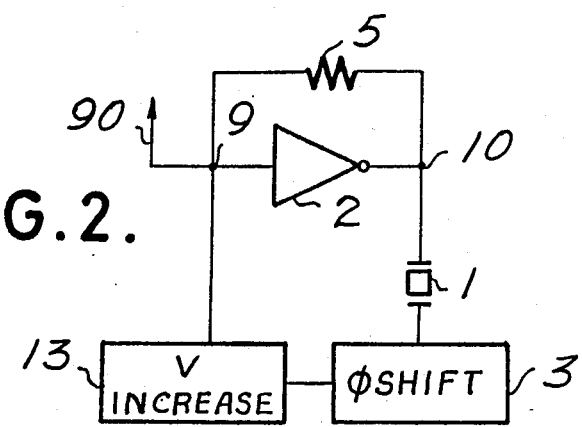
FIG. 2 is a schematic diagram of the oscillator according to the present invention.

FIG. 2 shows an example of an oscillator according to the present invention.

The oscillator according to the present invention has a logic gate, for example an inverter. The logic gate has an input 9 and an output 10. At the output 10, the logic gate 2 is connected to a resonator 1. The resonator 1 is, for example, a quartz crystal or a lithium niobate crystal. The resonator generates either bulk waves or surface acoustic waves.

Advantageously, the resonator 1 is an AT-cut quartz crystal. The output of the resonator 1 is connected to a phase-shifting device 3. The phase-shifting device 3 induces a lag in the propagation of the signal. The output of the phase-shifting device 3 is connected to a voltage-increasing device 13.

Advantageously, the voltage-increasing device 13 is a passive device comprising, for example, self-inductance coils and capacitors or a transformer.

The order of the phase-shifting device 3 and the voltage-increasing means 13 can be reversed without going beyond the scope of the present invention. Similarly, the voltage-increasing means 13 and the phase-shifting device 3 can be combined in a single device.

Figure 4:
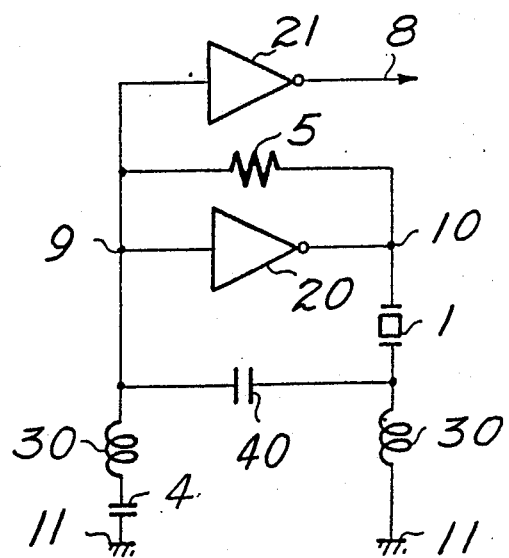
FIG. 4 is a diagram of a second embodiment of the oscillator according to the present invention.

The phase-shifting device induces a lag needed for the operation of the oscillator according to the present invention. The lag is reduced as the frequency is raised. Thus, for operation at high frequency, the phase-shifting device 3 may prove to be unnecessary. An embodiment of this type is shown in FIG. 4.

The output of the voltage-increasing means is connected to the input 9 of the logic gate 2.

The input 9 of the logic gate 2 is connected to the output 10 of said gate by means of a bias resistor 5.

The embodiment that has not been shown uses a resistor series-connected with a self-inductance coil to bias the logic gate 2.

Advantageously, the phase-shifting device 3 is a reactive phase-shifting device. Thus, it induces no noise unlike the resistor 6 of FIG. 1.

The resistor, or the resistor and an inductor (not shown) 5 provide d.c. negative feedback and bias to the logic gate 2. Since the logic gate is an inverter, the mean values of the input voltages at the point 9 and of the output at the point 10 are thus identical.

The resonator 1 is directly driven by the output signal of the logic gate 2. This enables a more efficient use of the dynamic range of the logic gate 2. The use of the voltage-increasing means 13 makes it possible to increase the input voltage of the logic gate 2 and to match the impedances. Thus, the impedance provided at the resonator 1 may be relatively low, thus giving a better load overvoltage factor. Furthermore, the input dynamic range of the logic gate 2 is entirely used.

In a first alternative embodiment, the device giving the desired reference frequency is connected to the output 10 of the logic gate 2.

Advantageously, the output 90 of the device is connected to the input 9 of the logic gate 2. In this case, a better signal-to-noise ratio is obtained, especially beyond the modulation frequencies $f_o/2Q$.

Advantageously, the logic gate 2 is made with CMOS or HCMOS technology.

The spectra of the oscillator according to the present invention can be described by Leeson's model. Leeson's model is described, in particular, by D. B. Leeson in "Simple Model of Feedback Oscillator Noise Spectrum", IEEE Proceedings, February 1966, page 329, and by G. Sauvage in "Phase Noise in Oscillators: A Mathematical analysis of Leeson's Model" IEEE Transactions on Instrumentation and Measurement, December 1977, page 408.

Figure 3:
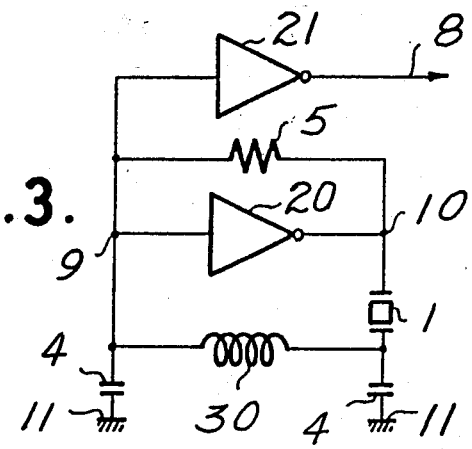
FIG. 3 is a diagram of a first embodiment of the oscillator according to the present invention.

FIG. 3 shows an embodiment of an oscillator according to the present invention. The device of FIG. 3 has a first inverter gate 20, the output 10 of which is connected to a resonator 1. The output of the resonator is connected, firstly, through a capacitor 4 to the ground 11 and, secondly, through a self-inductance coil 30 to the input 9 of said inverter logic gate 20. The input 9 of the inverter logic gate 20 is connected to the ground 11 through a capacitor 4. The input 9 of the inverter logic gate 20 is connected to the output 10 of the inverter logic gate 20 through a bias resistor 5.

The self-inductance coil 30, associated with the capacitor 4, acts as a voltage-increasing means 13 and as the phase-shifting device 3. The inverter logic gate is, for example, made with non-buffered HCMOS technology of the HCU04 type. For example the circuit HCU04, marketed by the Motorola firm, comprising six elementary inverters in one package, is used.

Advantageously, the output 8 of the device according to the present invention is connected to the output of a logic gate 21. Thus, insulation and current amplification of the output are provided. The gate 21, connected to the output 8 is, for example, an inverter logic gate.

Advantageously, the input of said inverter logic gate 21 is connected to the point 9.

Advantageously, a second inverter logic gate is used, said second inverter logic gate belonging to the same package to provide amplification and insulation of the output. Thus, the proper functioning of the logic gate 21 is provided by the biasing of the logic gate 20.

In the embodiment shown in FIG. 3, an AT-cut quartz resonator has been used, working in fundamental mode or partial (harmonic) mode. This device works perfectly from low frequencies to high frequencies (H.F.). The operating limits for this example correspond to about 100 MHz, said limits being induced by the propagation time of the gate 20.

In the device of FIG. 3, the minimum noise was less than −175 dBc/Hz for modulation frequencies of over 100 kHz. The noise of the carrier at 1 kHz is about −162 dBc/Hz.

The oscillator according to the present invention is not limited to particular circuits or logic gates. The adapting of the oscillator for operation at higher frequencies is within the scope of those skilled in the art. For example, for frequencies of about 200 MHz, a band-pass type of impedance transformer is used, making it possible to introduce no additional phase shift, which is no longer necessary in a case such as this.

FIG. 4 shows an oscillator according to the present invention which concerns the use of high-pass filter as a voltage-increasing means. Depending on the value of the components used, a filter of this type may induce a phase lead enabling the oscillator to work at very high frequencies, compensating for phase lags induced in the loop of the resonator 1.

The output of the resonator 1 is connected to the input 9 of the logic gate 20 by a capacitor 40 and to the ground 11 by a self-inductance coil 30. In this case, the direct current is blocked by the resonator 1.

In an alternative embodiment, the self-inductance coil 30 is connected to the ground 11 by a capacitor 4.

The input 9 of the logic gate 20 is connected to the ground 11 through a self-inductance coil 30 and a capacitor 4.

The capacitors 4 are coupling capacitors designed to prevent the flow of direct current.

Figure 5:
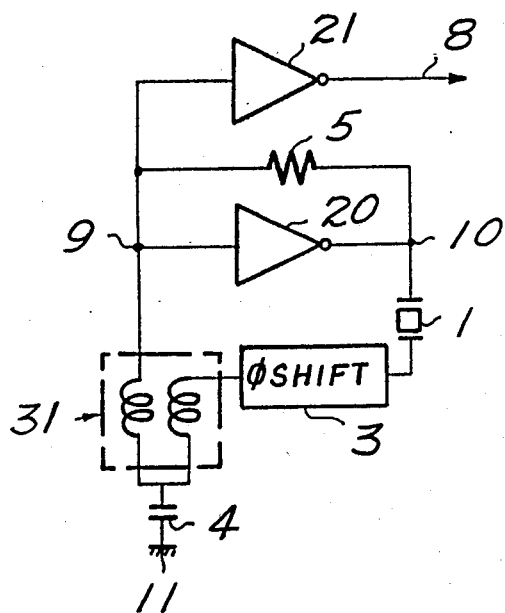
FIG. 5 is a third example of an embodiment of the oscillator according to the present invention.

FIG. 5 shows an alternative embodiment in which the loop comprising the logic gate 20 and the resonator 1 is closed by a transformer 31.

The transformer 31 has a primary coil connecting the output of the resonator 1 to ground 11 through a capacitor 4.

The transformer 31 has a secondary coil connecting the input 9 of the logic gate 20 to the ground 11 through a capacitor 4. The primary and secondary coils are coupled by mutual inductance.

For high operating frequencies, the output of the resonator 1 is directly connected to the input of the transformer 31.

In an alternative embodiment of the device according to the present invention, the cold points of the coils of the transformer 31 are connected to a first electrode of a capacitor 4. The second electrode of the capacitor 4 is connected to the ground 11.

For lower operating frequencies, the output of the resonator 1 is connected to the input of the transformer 31 through a phase-shifting device 3.

The transformer 31 acts as a band-pass filter that induces no phase lag or lead in the signal.

The invention can be applied mainly to the making of oscillators that are highly stable, especially in the short term, and to the making of devices using oscillators of this type. Non-exhaustive examples of such devices include radars, transmitters, receivers, synchronizing devices, motor control devices, clocking devices and computers.

What is claimed is:

1. An oscillator comprising:
    a piezoelectric resonator;
    a logic circuit;
    voltage-increasing means connected in a loop between an input and an output of said logic circuit; and
    means for biasing said logic circuit, including at least one of a resistor and a self-inductance coil.

2. An oscillator according to claim 1 further comprising a phase-shifting device connected in said loop.

3. An oscillator according to claim 1 or 2 wherein the voltage-increasing means are passive means.

4. An oscillator according to claim 3 wherein the voltage-increasing means comprise a self-inductance coil in series within said loop, and capacitors between the loop and ground.

5. An oscillator comprising:
    a piezoelectric resonator;
    a logic circuit;
    voltage-increasing means connected in a loop between an input and an output of said logic circuit; and
    means for biasing said logic circuit, including at least one of a resistor and a self-inductance coil, wherein the voltage-increasing means comprise a passive transformer.

6. An oscillator according to claim 1 wherein the logic circuit is an inverter.

7. An oscillator according to claim 1 wherein the logic circuit is made with CMOS technology.

8. An oscillator according to claim 7 wherein the logic circuit is made with HCMOS technology.

9. An oscillator according to claim 1 wherein the output of said oscillator is connected to the input of the logic circuit.

10. An oscillator according to claim 1 wherein the piezoelectric resonator is a quartz crystal.

11. An oscillator, comprising:
    an oscillating circuit, including a resonator and a logic circuit for producing an output signal having a level that is related to its input signal, connected to said resonator; and
    means for increasing a voltage of said output of said logic circuit, connected in a loop between said output signal, and said input signal.

12. An oscillator as in claim 11, wherein said voltage increasing means includes a coil having its ends connected between said input and output signals.

13. An oscillator as in claim 12, further comprising at least one capacitor between said coil and ground.

14. An oscillator as in claim 12, wherein said coil is a transformer.

* * * * *